United States Patent
Clifton, III

(10) Patent No.: US 11,602,078 B1
(45) Date of Patent: Mar. 7, 2023

(54) SYSTEM FOR A REMOTE, ACTIVE PHASE-TRANSITION COOLING SYSTEM UTILIZING A SOLID-STATE MODULAR CONNECTOR SYSTEM AS A METHOD FOR HEAT-TRANSPORT

(71) Applicant: Marcellus Lloyd Clifton, III, Philadelphia, PA (US)

(72) Inventor: Marcellus Lloyd Clifton, III, Philadelphia, PA (US)

(73) Assignee: Marcellus Lloyd Clifton, III

( * ) Notice: Subject to any disclaimer, the term of this patent is extended or adjusted under 35 U.S.C. 154(b) by 0 days.

(21) Appl. No.: 17/674,827

(22) Filed: Feb. 17, 2022

(51) Int. Cl.
| | | |
|---|---|---|
| G06F 1/16 | (2006.01) | |
| H05K 5/00 | (2006.01) | |
| H05K 7/00 | (2006.01) | |
| H05K 7/20 | (2006.01) | |
| H05K 5/02 | (2006.01) | |

(52) U.S. Cl.
CPC ....... H05K 7/20381 (2013.01); H05K 5/0213 (2013.01); H05K 7/202 (2013.01); H05K 7/20327 (2013.01); H05K 7/20354 (2013.01)

(58) Field of Classification Search
CPC ............. H05K 7/20381; H05K 7/202; H05K 7/20327; H05K 7/20354; H05K 7/20363; H05K 7/20336; H05K 7/20318; H05K 7/20309; H05K 7/2029; H05K 5/0213; H05K 5/0212; H05K 5/0214; H05K 5/0215; H05K 5/0216
See application file for complete search history.

(56) References Cited

U.S. PATENT DOCUMENTS

| | | | | |
|---|---|---|---|---|
| 2,932,953 | A * | 4/1960 | Becket | F25B 21/02 62/119 |
| 7,019,974 | B2 * | 3/2006 | Lee | G06F 1/20 174/15.2 |
| D829,673 | S * | 10/2018 | Mira | D13/179 |
| 10,260,781 | B2 * | 4/2019 | Lin | F25B 21/02 |
| 10,921,067 | B2 * | 2/2021 | Lan | F28F 1/045 |
| 10,930,575 | B2 * | 2/2021 | Subrahmanyam | H05K 7/20445 |
| 11,129,305 | B2 * | 9/2021 | Raeth | H05K 7/20409 |
| 11,137,175 | B2 * | 10/2021 | Lan | H05K 7/20263 |
| 2008/0164006 | A1 * | 7/2008 | Karamanos | F28F 9/002 165/163 |
| 2012/0192574 | A1 * | 8/2012 | Ghoshal | F28D 15/0266 62/3.2 |
| 2016/0118317 | A1 * | 4/2016 | Shedd | F28F 9/26 257/712 |
| 2017/0318710 | A1 * | 11/2017 | De Bock | H05K 7/20681 |
| 2018/0031285 | A1 * | 2/2018 | Thomas | F25B 21/04 |

* cited by examiner

Primary Examiner — Anthony M Haughton

(57) ABSTRACT

An active phase change cooling system and modular connector for heat transportation consisting of: two heat exchangers, a compressor, a flow limiting orifice, a heat source surface transfer component, a heat transfer plate to deliver heat to the heat exchanger and a modular connectors bridging the gap between the heat source and the heat exchanger. Packaged in a mostly sealed environment where heat is delivered to the fluid and via directed air flow, excess heat is exhausted to the external environment.

2 Claims, 7 Drawing Sheets

Figure 1:
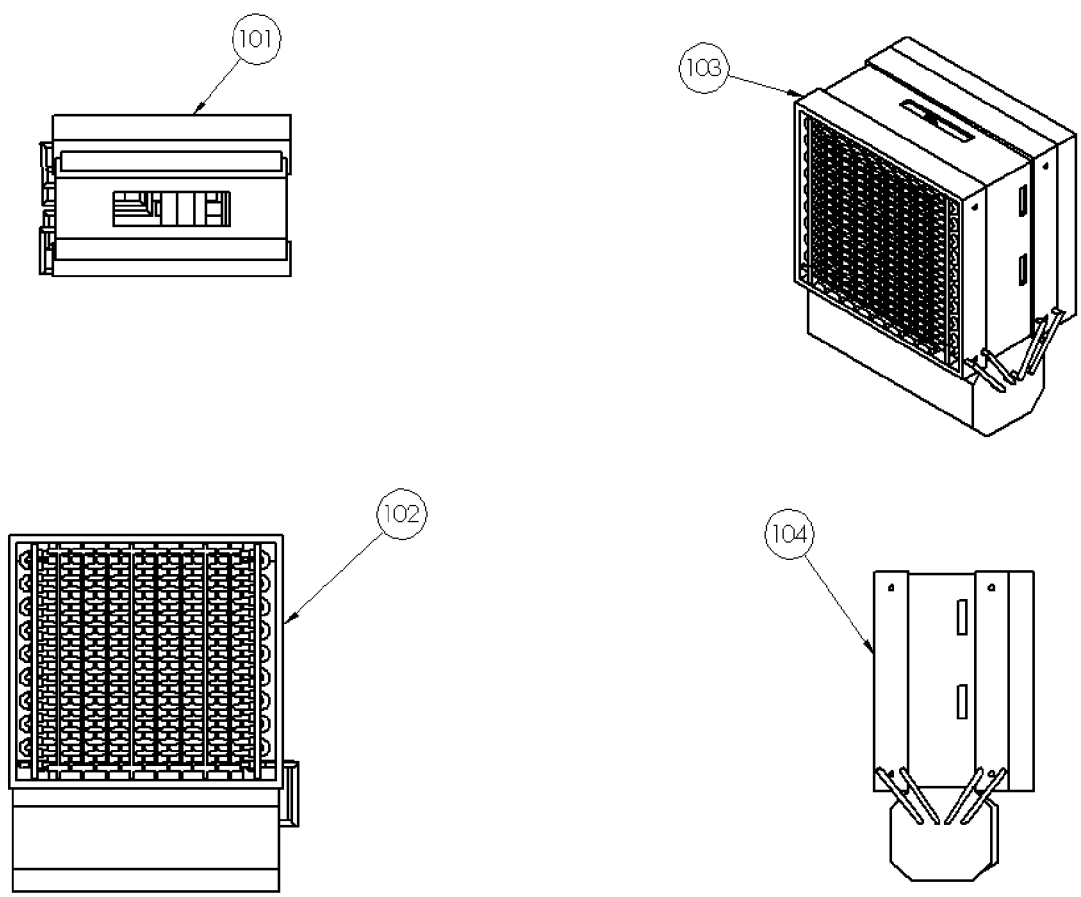

SYSTEM FOR A REMOTE, ACTIVE PHASE-TRANSITION COOLING SYSTEM UTILIZING A SOLID-STATE MODULAR CONNECTOR SYSTEM AS A METHOD FOR HEAT-TRANSPORT

BACKGROUND

1. Field of the Invention

The present invention is in the field of electronics cooling via phase-change heat extraction and pertains particularly to methods and apparatus for the creation of improvements upon dimensional packaging and modular solid-state interfacing from the electronic heat source to the phase-change heat extraction system.

2. Discussion of the State of the Art

Phase change heat extraction is a cooling method which works by manipulating a chosen fluid to achieve the most heat capacity and using that state to remove heat from the chosen environment, location or object, providing temperature control. Multiple fluids with various properties have been selected in the past based on desired lowest temperature, external environment temperatures, losses in the system and fluid properties. Phase change cooling is a proven method to efficiently remove heat from an environment and/or material, commonly used for temperature control of vehicle cabins, commercial and residential residence and food storage.

Electronic devices utilize electrical properties to perform tasks and automate processes to save user's time and energy. Electronic components are currently found in most modern technology such as, computers, video game consoles, mobile phones, office devices, scientific tools, vehicles, and manufacturing tools. Recent increases in power demand due to the increased complexities within tasks required of the components has driven an increase in the cooling capacity needed to operate these devices at power levels required for task completion. Adding to this cooling demand increase is a decrease in the size of the components and a decrease in space to package the electrical components and their cooling solution. The components also have a sensitivity to exposure to common liquid methods of cooling and solid-state methods of cooling have a size and weight limitation. As the size decreases and power increases the heat concentration increases as well and makes cooling requirement greater. If left unchecked the heat created will shorten the lifespan of the component, at best or cause component failure at worst.

Current electronic component cooling methods primarily involve single material state methods to either increase the surface area of the cooling material, increase the thermal capacity of the cooling material, or passively transferring heat between multiple cooling materials. Examples of the above are heatsinks, thermosiphons, and liquid to metal cooling. All the current cooling methods work via directly connecting the chosen cooling method to the cooling device, where heat is transferred from a small area to a significantly larger one in order to aid the heat dissipation from the electronic component to the environment.

The most common method of cooling electronic components is the method of connecting electronic devices to a metallic heat extraction interface and is typically of direct surface contact or in contact with a thermal interface material which aids heat transfer from the electronic device to the metallic heat extractor and is then exhausted away to cool the metal. In direct contact solutions, contact between the heat source surface and heat exchanger ensures that the heat extraction takes place in a minimal distance from the electronic component producing heat. This means that the amount of material used for the heat exchanger is limited in by dimensional constraints due to the limitations of the material used for mounting or the dimensional constraints within the component housing. These limits on heat exchanger material and most importantly surface area limits how much heat can be removed from the heat producing electronic device.

There is an alternative found in electronic component to fluid heat exchangers, which bypasses the weight limit imposed by the electronic control board. There is only a minimal amount of metal attached to the electronic heat producing device, but fluid is pumped into contact with this metal interface, then pumped to another larger metallic heat exchanger, remotely located. This increases the thermal capacity of what metal is currently in contact with the electronic device, by utilizing fluid to deliver the heat to a larger metal device which is responsible for exhausting the heat within the fluid. While this bypasses the weight restraint, it introduces another electronic device issue. In the event that the fluid escapes from the either of the metal exchangers or the transfer piping and comes in contact with the electronic control board the electronic device will fail to operate.

SUMMARY OF INVENTION

The issues noted above within conventional methods for cooling electronic components involve component safety and heat exchanger size limitations, both have a limiting effect upon the amount of cooling provided to an electronic component. The inventor therefore considered the functional elements of an electronics cooling system to devise a cooling system that provides greater cooling while removing the potential for harmful exposure to the cooling substance, and circumventing the weight and size limitation within solid state cooling.

The cooling method utilized in this invention is one of active phase change. This process relies on a chosen fluid in one state or phase, being converted to another due to changes in pressure and/or temperature. With this change the fluid is capable of receiving heat from the electronic component(s), which will decrease the temperature of the component(s). Utilizing an active phase change cooling system, the fluid can be manipulated into a state where its temperature is much lower than the ambient. This largely increases the amount of heat transferred away from components due to heat moving to colder areas until equilibrium temperature can be reached. Also, as the temperature of the phase change fluid is lower than ambient, the lowest temperature is much lower than what is possible with any traditional cooling solution, where ambient air temperature is used primarily to cool the fluid or solid containing the heat from the electronic component. This allows for more heat to be removed from the electronic component(s) and a lower operating temperature is achieved. Accompanied by a solid-state modular connector loop used for heat transportation, heat production from the electronic component(s) can be transported to the cooling system without risk of exposure to the fluid used for cooling. The usage of a heat transport system also provides the benefit of bypassing dimensional limitations as the primary cooling system is external to the electronic component(s) instead of placed in direct contact.

The components within this invention are presented according to an embodiment of the present invention, which is an active phase change cooling system utilizing a modular solid-state connector for heat transportation comprising: a cooling system: made up of heat exchangers for fluid interaction, a compressor to drive phase change process within the fluid, a motor and motor controller to power and control the compressor, fluid transport pipes to deliver fluid to specified location, insulative material to maintain temperature within the system and prevent leaks to the external environment, and a housing to store cooling system components within; and a modular connector system: made up of individual connectors containing: a connector body with features for connection to other connectors, used primarily to transport heat; material which performs the role of insulator to maintain temperature within the connector body, and a housing with features to attach to the connector body, used to contain sub-components. Both systems are aided by heat transportation plates containing: a metallic body primarily used for heat transportation, insulative material to maintain temperature with the heat plate, and a housing with features to connect to the heat transfer plate and to hold the component in its specified location, placed in contact with the electronic component(s) to be cooled and the cold side heat exchanger to complete the totality of the invention, in this embodiment. The total system is then installed in a location of the end user's choice, by utilizing a provided mounting bracket. The mounting bracket is shaped to secure the components within the housing, using fixture points within the cooling system housing and exchangers and is strong enough to support the weight of the complete system in all directions. Upon installation of the cooling system and assembly of the individual modular connectors into a connector loop, a connection is formed from heat source to cooling source.

The operating process of the invention in the present embodiment, is a conventional phase chase process occurring within the cooling system, and heat transportation from the electrical component(s) to the cooling system occurring within the modular connector loop. Within the cooling system, a fluid enters the compressor at one state and exits at another state. This fluid is then passed through one heat exchanger to remove heat from the fluid and exhausted to the external environment, with assistance from an exhaust fan. After leaving the heat exchanger, the fluid passes through a transfer pipe which assists the modification of the fluid to reach the lowest temperature possible. Once that process is completed, the fluid is transferred to the heat exchanger that is connected to the heat transfer plate within the cooling system, and is connected to the heat source via the modular connector loop. The modular connector loop, attached to the electronic component(s) producing heat, transports heat into the heat plate connected to the heat exchanger within the cooling system. The heat is then transferred to the fluid via the connection, and is responsible for changing the fluid into its initial state, prior to retuning to the compressor and beginning another loop.

Simple Description

FIG. 1 contains multiple views of the cooling system without a mounting mechanism, in an embodiment of the present invention.

Figure 2:
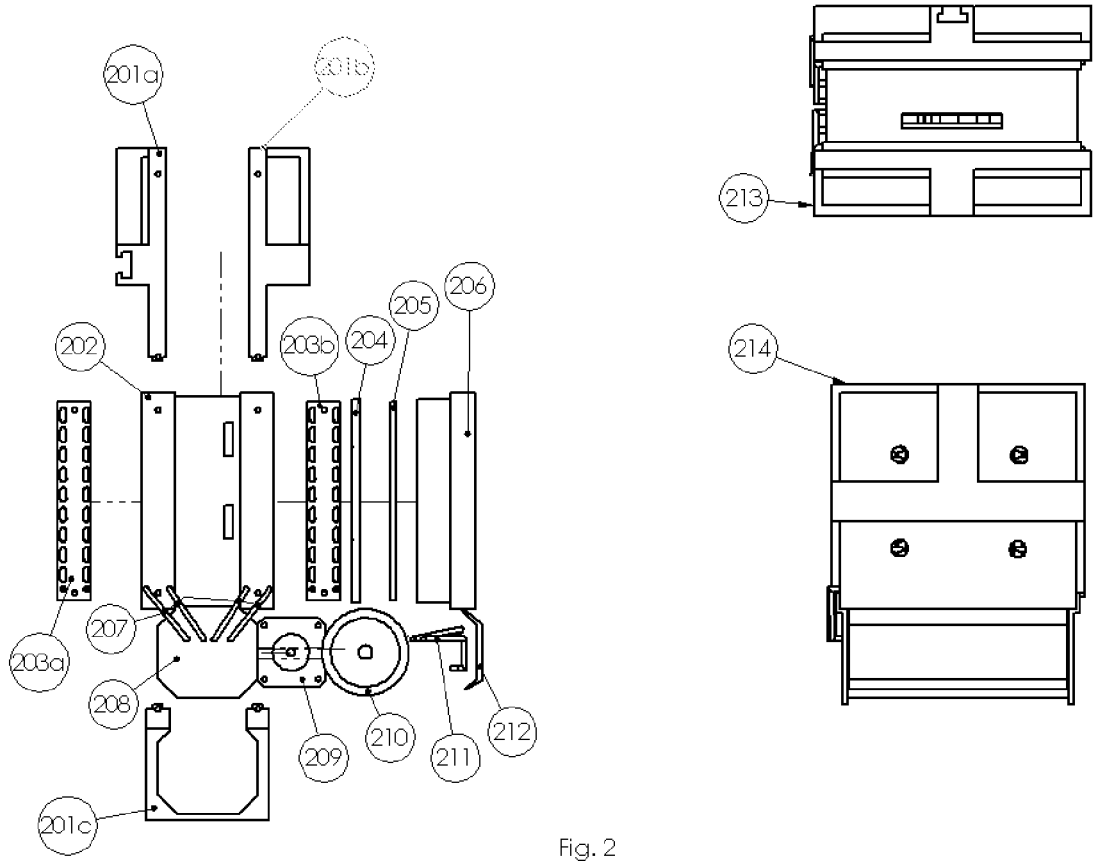

FIG. 2 contains an exploded view of the cooling system components, and assembled views to illustrate the system as described in an embodiment of the present invention.

Figure 3:
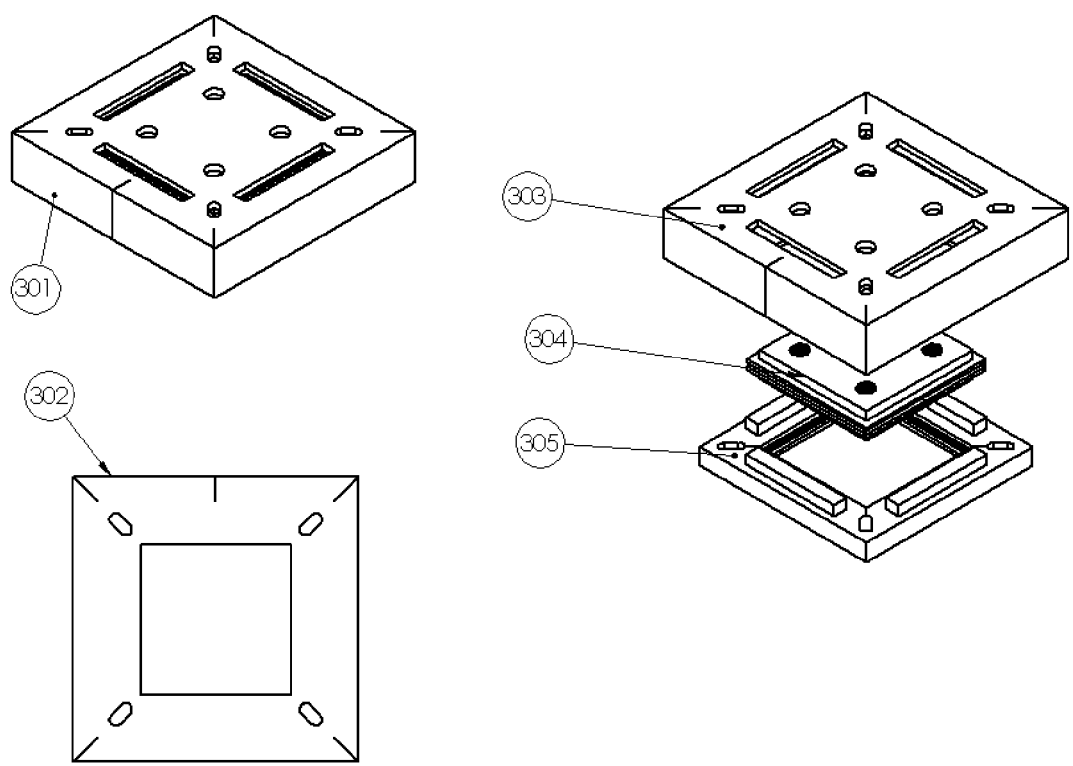

FIG. 3 contains multiple views of the heatsink assembly and an exploded view of the components which make up the heatsink assembly, to illustrate the component in an embodiment of the present invention.

Figure 4:
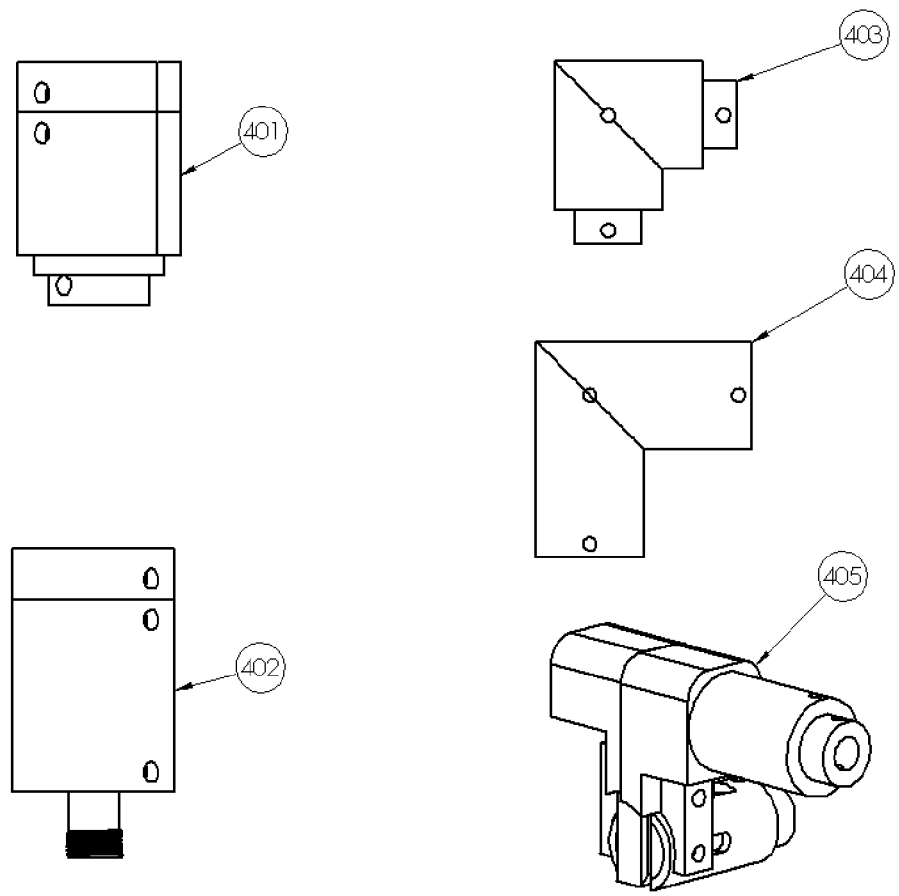

FIG. 4 contains a single view of the individual modular connectors as described in an embodiment of the present invention, which when combined make a complete modular connector loop.

Figure 5:
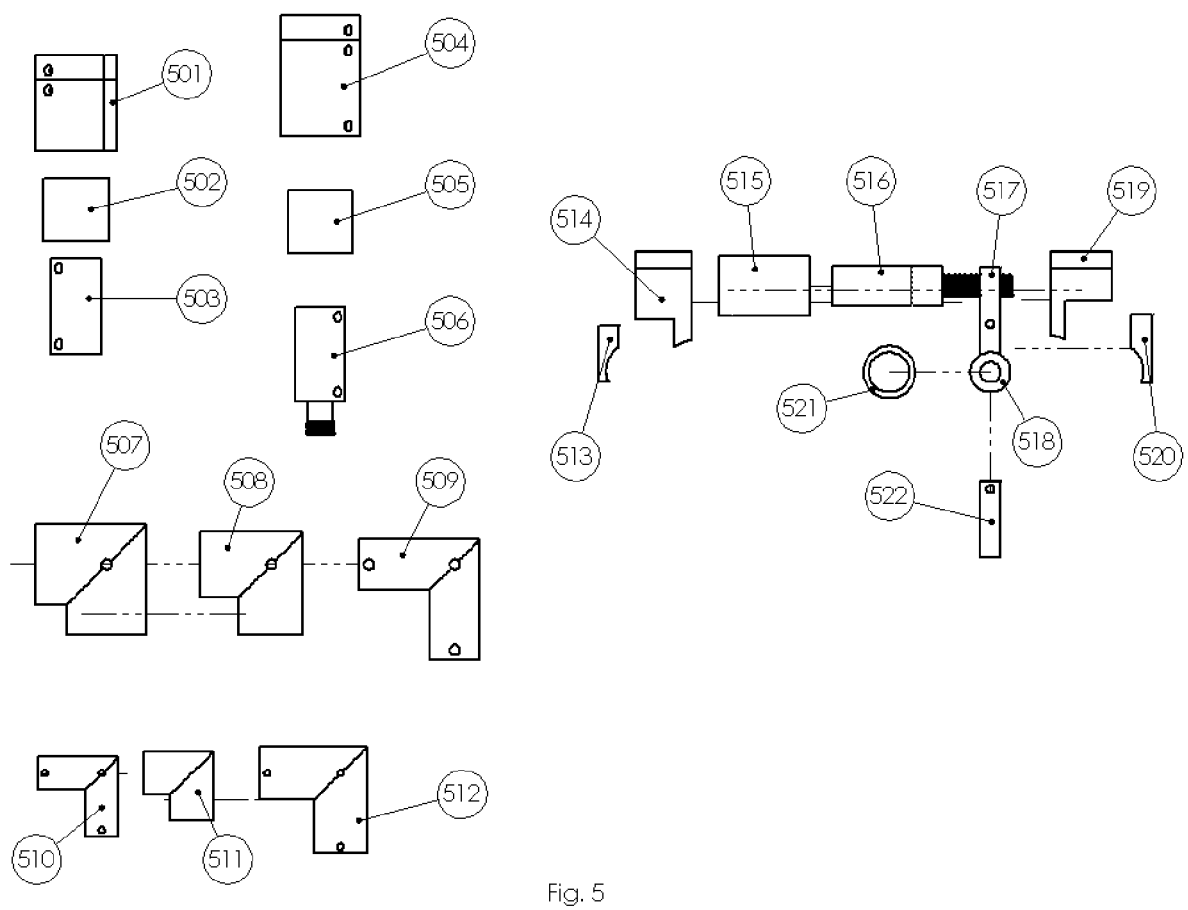

FIG. 5 contains an exploded view of each individual modular connector, which shows the components that make up each connector, as described in an embodiment of the present invention.

Figure 6:
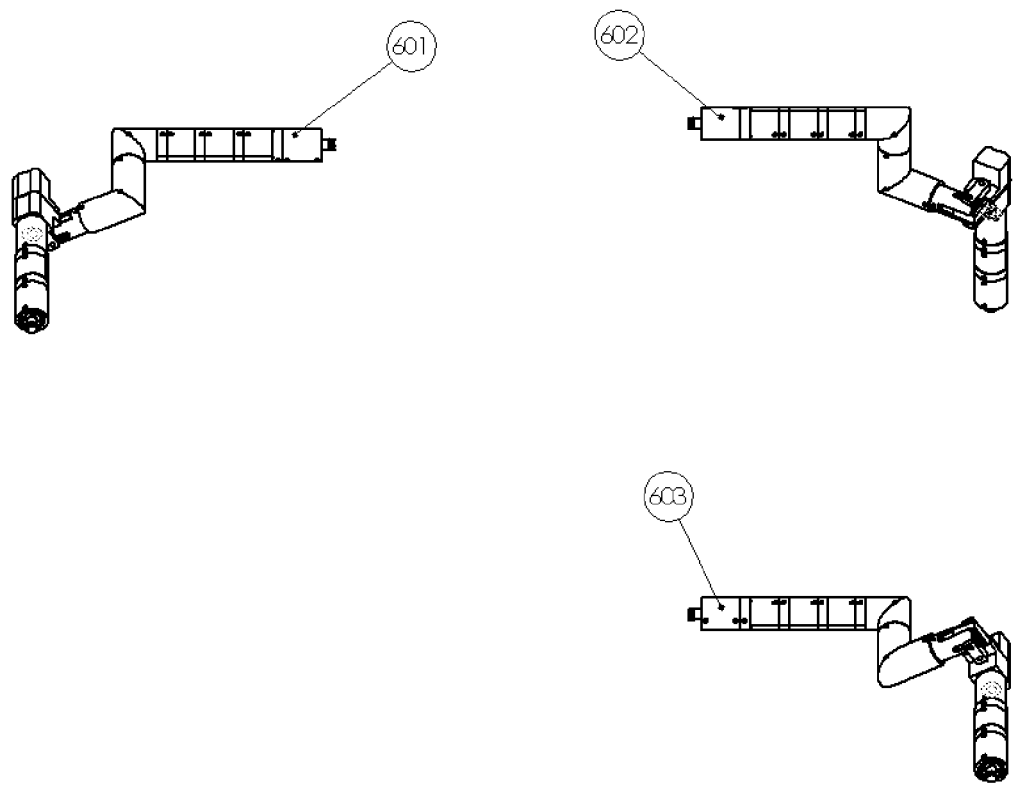

FIG. 6 contains multiple views of the modular connector loop, assembled in a manner to reflect the description of an embodiment of the present invention.

Figure 7:
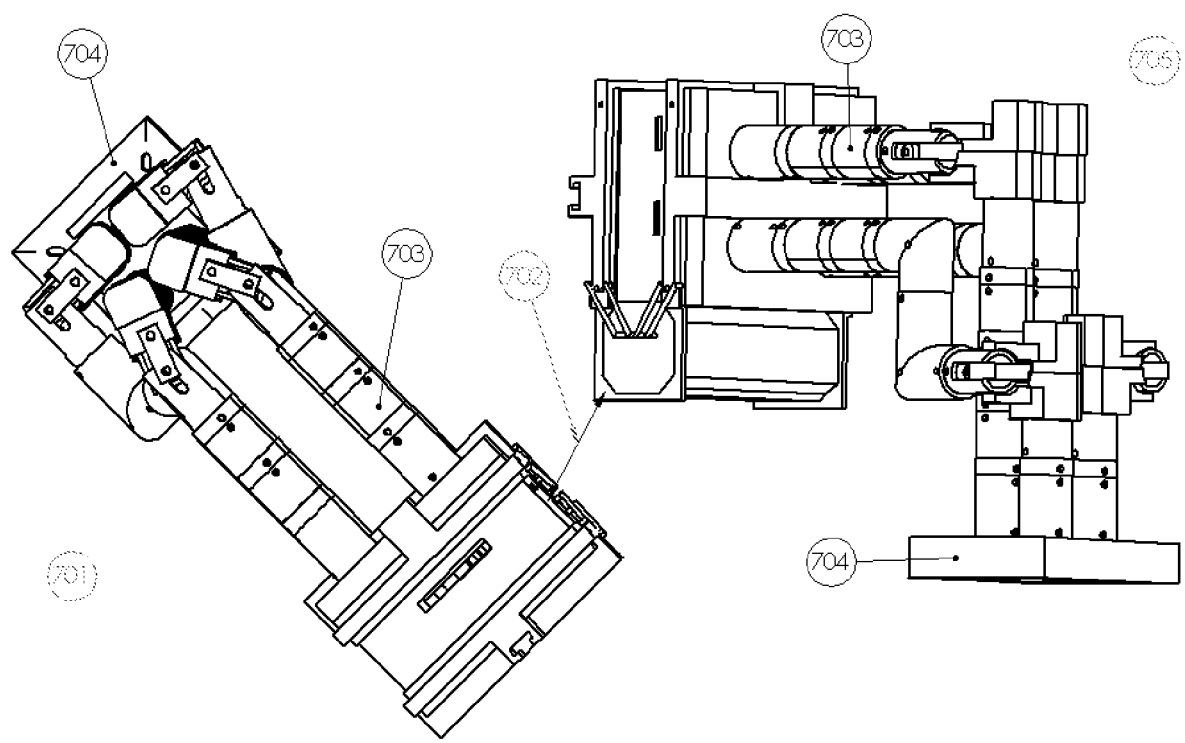

FIG. 7 contains multiple views of the complete invention which contains the assembled cooling system, heatsink assembly and modular heat transportation connector, as described in an embodiment of the present invention.

DETAILED DESCRIPTION

The inventor provides a unique cooling system for use in lowering the temperature of electronic devices. The new system incorporates lower operating temperature, the ability to remotely contain the fluid responsible for heat extraction, and the ability to connect from heat source to cooling device using configurable connectors. The present invention is described in enabling detail in the following examples, which may represent one possible embodiment of the present invention.

FIG. 1 provides multiple views of the cooling system without the mounting bracket installed. The cooling system responsible for the majority of cooling the connected device (s), according to an embodiment of the present invention. It is referred to as the Phase Change and Heat Extraction Assembly in various sections in this document. This component is used to control the primary modality of cooling, utilizing active phase change process to manipulate a fluid to get the most cooling potential out of the fluid used within the system. This cooling system has the functionality of being a remote method of cooling by containing the fluid responsible for heat extraction within a separate housing, and providing connections that transport heat from the heat source to the cooling system. The cooling system contains the fluid for cooling, which is the primary method of removing heat from the heat source, and is made possible by manipulating the fluid to achieve an optimal state for heat extraction. In other cooling systems, the fluid is used as a medium to transfer heat away from the heat source and provides a failure point which can cause complete system failure if exposed to the heat source or components which power the heat source. This cooling system is specifically designed to provide maximum heat extraction from the heat source without the potential for exposure to the cooling fluid, which can lead to failure.

FIG. 2 shows the components that make up the cooling system, and multiple views of the assembled cooling system, including the mounting bracket.

The Primary Cooling System Housing 202 is the component which holds the heat exchangers and the exhaust fan; which are responsible for removing heat from the fluid, transferring heat from the connected components to the fluid and exhausting the heat from the system to the environment. The component is made up of a thermoplastic, which is then modified to include: compartments for placement of the heat exchangers, threaded holes for fastening the exhaust fan and heat exchangers, openings for airflow over heated components, and locations for the fastening of the mounting bracket. Within the housing is also an additional housing which mentioned bellow as the Compressor Housing. Within this embodiment, the housing is shaped and sized to accommodate the components within and as a result is shaped accordingly, in other embodiments it is known that the housing is capable of maintaining an exterior and interior polygonal shape containing any number of sides, comprised of any number of shapes and maintaining any dimensional characteristics, provided the housing components are contained and mounted within. Also, in other embodiments it is possible to use any material to form the housing, provided the material maintain a solid state at the range of operating temperatures the cooling system experiences.

Mounting Bracket 201a, 201b and 201c, includes the mounting and containment bracket used to not only rigidly contain the cooling system sub-components within the housing, but for mounting the cooling system to the user specified location. Using fastening locations on the face of the mounting bracket, it is possible to fasten said bracket through the housing to the threaded hole locations within the heat exchanger. The mounting mechanism is made up of four threaded rods which can be used to mount the cooling system in any configuration provided the nuts are used to secure the mounting face to the threaded rods on the mounting bracket. The mounting bracket in this embodiment, is made up of a metal with the following properties: ability to maintain a solid state at the range of operating temperatures the cooling system experiences; is capable of withstanding the stresses caused by the weight of the cooling system components, fastening to the housing and heat exchangers, and tension caused by mounting; and be capable of being manipulated into the desired shape to contain the cooling system components. The mounting bracket is made by shaping the metal into a shape which surrounds the exterior of the cooling system housing, then threaded features are added to provide locations for fastening to the housing, and threaded locations for the threaded rods to be installed for mounting the bracket to the desired location. Also, in other embodiments it is possible to manufacture the bracket and its features via a method of fusing smaller quantities of the chosen material together until the desired shape and features are reached, instead of removing material until the desired shape and features are achieved. In other embodiments, the mounting methods for both bracket attachment and bracket mount, may include non-threaded fastening, magnetic securement, permanent fixturing methods, or any other form of attachment and includes the combination of attachment methods. In reference to the material used, in other embodiments, it is possible to utilize any material that meets the criteria for strength and temperature range stability instead of the material selected in this case. It is also possible to have a differing dimension of the mounting bracket as the specification for dimensional size is driven by the size of the components within the cooling system and the desired mounting location potential.

The Cold Side heat exchanger 203b is used within the cooling system for heat extraction from the heat source, and is in contact with the Heat Transfer plate 204, where the F.C. is connected. The cold side heat exchanger is a component whose role in the cooling system is to transfer heat to the fluid flowing within the exchanger via connection to the heat transfer plate. This heat exchanger is the primary location of the majority of the cooling potential within the system. It is currently shaped to provide maximum surface area for contact with the heat transfer plate and correct flow of the fluid in a state that provides the most potential for heat transfer into the fluid. In its presented embodiment, the heat exchanger is created by shaping metal tubing into the desired dimensions, then manufacturing fins to occupy the dimensions and contain the required features, and is completed by thermally connecting the tubing to the number of fins to create a complete heat exchanger. In other embodiments, it is possible for the heat exchanger to be manufactured via combining finite sized particles of either liquid or solid-state material to meet the required shape and features of the heat exchanger. In this embodiment the heat exchanger components are made of the same material which meet these criteria: ability to withstand the stresses created by the fluid in the state of maximum cooling potential; ability to withstand the stresses caused by fastening and supporting the weight of the total cooling system when mounted via the mounting bracket; high heat capacity and heat transfer properties; and ability to be manipulated into the desired shape driven by design criterial. It is possible in other embodiments to use any material which meets these criteria, or a combination of materials to fulfill this requirement. In this embodiment the fin and fluid tube shape, dimensions and arrangement are driven by amount of space within the housing assembly and total heat the cooling system is designed to remove, in other embodiments it is possible for these components to be modified for differing appearance, shape, and size, in order to meet the desired specification to accomplish the task of delivering heat to the fluid within the exchanger.

The Hot Side heat exchanger 203a is used within the cooling system for expelling heat from the fluid during the compression phase of the phase change process, with assistance from the cooling system exhaust fan. This component is the same as the cold side heat exchanger, except in function within the cooling system. This component is connected to the compressor via a transfer pipe and also connected to an expansion transfer pipe to the cold side heat exchanger. The hot side heat exchanger is also used to as a fixturing point for the mounting bracket to be fastened to through the cooling system housing. In alternate embodiments, it is possible to utilize material to transfer heat from the hot side heat exchanger to the cold side heat exchanger or to the atmosphere, effectively removing the usage of a fan to exhaust heat to the external atmosphere.

Secondary Cooling System Housing 208 is used to house the compressor assembly, the transfer pipes and the components used to secure the compressor assembly to the housing. The Compressor Housing is made of a thermoplastic which meets the criteria of: capability of maintaining solid state when exposed to the temperature range of the components within, and is capable of withstanding the stresses caused by fastening the components to their locations. This material is then modified to include: mounting and fixturing points for the components to be secured; connection to accept the hinged door component; and additional features added in to improve airflow over the compressor assembly. In this embodiment, the compressor housing is formed via material removal until the required features are created, and in alternative embodiments it is possible to manufacture the housing via combining finite sized particles of either liquid or solid-state material into the desired shape, containing the desired features. Also, in other embodiments the interior and exterior dimensions may differ, driven by the dimensional differences and requirement to fit and secure, the components the within the housing. There are alternate embodiments where the method of mounting the components within the housing may differ from the use of fasteners and threaded features, it may utilize magnetic fixturing, permanent fixturing, or the use of physical features within the material to secure the components within the housing. Also in other embodiments the material may differ from the material of the main cooling system housing, or any thermoplastic, provided the material meets the design requirements of: maintains a solid state while exposed to the range of temperatures provided by the components within the housing; and is capable of withstanding the stresses caused by the weight and processes taking place within the components; is capable of modification for features which provide enclosure and securing of the components within the housing Secondary Housing Hinged Door 212 is a hinged door assembly responsible for allowing access to the compressor assembly and transfer pipes within the housing. The Compressor Housing Hinged Door is made of the same thermoplastic material as the compressor housing, and is then modified to include: a location to accept the hinged feature and a feature to secure the door in the closed position. The hinged feature is used to provide a non-fixed attachment point for the door to be opened and closed to provide access to the components within the compressor housing assembly. The locking mechanism in this embodiment is a screw, which is used to secure the door in the closed position and secures the door in place during assembly, mounting, and usage of the cooling system. In other embodiment, the compressor hinged door may differ in: shape, provided it is driven by the dimensional constraints imposed via on the shape of the compressor housing, which the door is used to complete the enclosure; the placement of the door on any face of the compressor housing, provided the door complete the enclosure of the housing and maintain access to the components within; the method used to secure the door in the closed position may differ from utilizing threaded features and a fastener, and may instead utilize magnets or the arrangement of material which provides a feature which holds the door secured; the chosen material, provided it meets the requirements of: maintaining a solid state at the operating temperature range of the components within; is able to be modified to accept features for mounting and securing to the housing; and able to withstand the stresses applied by the mounting and securing features via their components; the addition of insulative materials to separate the components within from the external environment; and the method of manufacturing may differ from removing material until the desired features and dimensions are achieved and instead combine finite sized particles of either liquid or solid-state material into the desired shape, containing the desired features.

Compressor assembly 210 is used to modify the pressure and the flow of the fluid in use for heat extraction. During the phase change process, in order to bring the fluid to the desired state, a method of pressure modification is required. In this case, a compressor is used and is made up of three sub-components listed as: the compressor upper and lower casing, the compressor rotor and the compressor shaft. There are also many minor components within the compressor, not shown, that aid the sub-assembly of the compressor in maintaining a sealed environment, pressure and flow control, bearings for shaft balance and lubrication for gears in contact to prevent friction wear.

The compressor assembly begins with the compressor casing, which contains: features to secure the upper and lower casing together and compress the rotor and shaft sub-components into place for operation; features to hold the bearings in place which go in-between the shaft and the lower casing; features to hold the O-rings in place which create a seal to maintain the fluid within the compressor and prevent escaping under pressure to the external environment; features to accept the transfer tubing and control valve components; and features to secure the compressor casing to the compressor housing via fasteners.

The compressor wheel is the sub-component of the compressor assembly which is placed inside of the compressor casing and is connected to the compressor shaft via gearing features within the compressor. The compressor wheel is responsible for compressing and propelling the fluid within the cooling system, to actively create conditions that facilitate a phase change among the fluid. The compressor is an oil-less rotary style compressor which relies on a difference in dimensional shape among different locations on the compressor wheel to create a pressure and flow differential among a full rotational cycle of the compressor.

The compressor shaft is a sub-component of the compressor assembly which is connected to the compressor wheel via gear-mesh features on the face of the compressor shaft and the compressor drive motor 209, in order to rotate the compressor at the desired speed and with enough force to drive the compressor wheel through its full rotational cycle. This sub-component is held in place via features within the compressor housing which maintain the position of the compressor shaft; and features within the shaft which maintain a stable connection from the shaft to the drive motor.

The three main sub components are made of the same material, which was selected based on these properties: ability to maintain solid state at the operating temperatures that the fluid may experience while within the compressor, ability to withstand the pressure created by the fluid at its highest pressure and maintain shape and not impede operation, ability to be modified to contain necessary shape and function, and anti-corrosive properties regarding fluid contacting the surfaces of the material. In alternate embodiments, the material of the three sub-components may differ from one another, and/or may be created from a different material altogether. The additional components for longevity and sealing are outside of the scope of this invention, and their material may vary based on design driven requirements.

The method of manufacturing the main sub-components are the same as well and rely on creation of the desired features: shaping and adding the features for fluid transfer piping and mounting features for the upper housing, addition of the gearing and the general dimensional package of the compressor wheel, and addition of the gearing and dimensional package of the compressor shaft; via material removal. In alternate embodiments the manufacturing process may involve combing finite sized particles of either liquid or solid-state material into the desired shape and containing the desired features to form each sub-component.

The assembly of the sub-components into a compressor is directed in this order: the compressor wheel and compressor shaft gears are meshed together, followed by the insertion of the bearings on the compressor shaft, followed by those components being inserted into the lower compressor housing, then the sealing O-ring(s) are added to the lower compressor housing, and is completed by the upper housing attachment to seal the compressor housing halves. The motor drives the compressor shaft, which is attached to the compressor wheel via the geared feature on both components. In this embodiment the compressor wheel and shaft are connected via gear-mesh features, and in other embodiments the compressor wheel and shaft can be connected via permanent connection or alternate semi-permanent connection methods, provided the connection is capable of withstanding the forces applied during operation of both components. This motor is controlled via an external power source which determines the speed of the motor, which is driving the compressor via the compressor shaft. In this embodiment, the power source is a standardized connector for electronic device control boards that include cooling fan control, in other embodiments, the power source can consist of any methodology that provides the cooling system requirement for voltage and power.

In alternate embodiments, the compressor can be used to modify the pressure in a manner that decreases the pressure of the fluid via modification of the compressor wheel dimensions and/or rotational direction. The compressor in this embodiment is used for fluid pressure increase but its role in the cooling system will be maintained in this and other embodiments as a fluid pressure and flow modifier.

In this embodiment the compressor is aided in operation by airflow pathways in the housing that holds the compressor assembly; the temperature difference between the ambient air being forced around the compressor assembly helps the drive motor and the compressor maintain functionality and longevity. In other embodiments it is possible to rout cooling passages from the cold side heat exchanger to the external compressor housing to perform the same task or in other embodiment, no cooling of the compressor assembly would be added.

The Fluid Transfer Pipes 207 and 211 are metal tubes that transfer fluid to and from the compressor and the heat exchangers and have features to modify flow. The fluid transfer pipes without flow restrictions created by modifying the body of the tubing, are fluid transfer and control components within the cooling system. By the addition of valving, the fluid transfer pipes are used to either hold the fluid in the staging position prior to entry to the compressor, or as aids in maintaining steady-state flow from the compressor to the heat exchanger. The fluid transfer piping with flow restrictions act as a transfer area for the fluid to stabilize during transportation away from one exchanger which held the fluid in one state, to another exchanger where the fluid will undergo operation in another state. The fluid transfer pipes are composed of the same material with these properties: ability to maintain solid state at the temperature range the fluid may reach; ability to withstand the pressures created by the fluid at the range of pressure and temperatures the fluid may reach; ability to be modified for connection to the compressor housing and the heat exchangers; and anti-corrosive properties when exposed to the selected fluid. This component is modified to create features to: facilitate the attachment of minor components such as threaded nuts for attachment to the compressor housing and heat exchangers; and control pressure and flow via a difference in diameter across a section of the piping. In the alternate embodiments the dimensions of the fluid transfer pipes may differ provided the change is driven by fluid properties and/or the dimensional differences of the heat exchangers and compressor, driven by their dimensional specifications to achieve a specific cooling potential. The material used in this embodiment of the fluid transfer piping are the same and in other embodiments may be of a different material or a combination of materials provided they meet the design criteria for: maintaining solid state at the temperature range of the fluid, strength to resist the stresses placed on the wall via the fluid, and anti-corrosive properties regarding interaction between the fluid and the pipe wall. In this embodiment the manufacturing method of the tubing involves removing material from tubing until the desired features are achieved, and in other embodiments the method of manufacturing may involve combing finite sized particles of either liquid or solid-state material into the desired shape, containing the desired features. Another alternate embodiment is the usage of insulative material to surround the fluid transfer pipes, in order to maintain the fluid temperature, prevent condensation and prevent heat transfer from occurring as a result of exposure to the cooling airflow over the compressor and heat exchangers.

The Heat Transfer Plate 204 is a metal plate which contains threaded holes, and is in contact with the Cold Side Heat Exchanger 203*b*. By utilizing the threaded hole features, the Threaded Connector sub-connector of the Modular Connector is able to transfer heat from the Heatsink connected to the heat source, all the way to the heat transfer plate, which is in contact to the cold side heat exchanger. This facilitates the extraction of heat from the heat source via heat transfer between the heat transfer plate and the fluid moving within the Cold Side Heat Exchanger. The heat transfer plate is made of an element capable of heat transfer and heat storage, and was selected based on the following properties: ability to be manufactured to provide the necessary size and features, ability to maintain a solid-state at the temperature range the heat transfer plate may experience, total heat capacity of the material, and heat transfer coefficient of the material. In this embodiment the manufacturing method of the heat transfer plate involves removing material from tubing until the desired features are achieved, and in other embodiments the method of manufacturing may involve combing finite sized particles of either liquid or solid-state material into the desired shape, containing the desired features. In this embodiment the material used to create the heat transfer plate is the same and in other embodiments the usage of a different material or a combination of materials is possible, provided the material(s) meet the design criteria of: ability to maintain a solid-state at the temperature range the heat transfer plate may experience, ability to be modified to design specification and features, total heat capacity of the material, and heat transfer coefficient of the material. The heat transfer plate is in contact with the heat exchanger in a semi-permanent manner, via compression from the arrangement of the cooling system housing components and held in place via the mounting bracket. The heat transfer plate is a member of the modular connector group and as so can be easily removed for ease of end user modification. In this embodiment, the heat transfer plate has four locations for threaded connectors to connect, in other embodiments it is possible to fit any number of connectors, to the heat transfer plate, either with or without additional components to facilitate the connection. In alternate embodiments it is possible to utilize a different method to secure a connector to the plate, it would involve a difference in the threaded connector male end no longer being threaded; in short the heat transfer plate features that provide connection to the connectors is driven by the given connection method and is within reason to be possible to be modified. Also, in other embodiments the usage of material that helps facilitate heat transfer between the heat transfer plate and the cold side heat exchanger may be utilized.

The Heat Transfer Plate Insulation 205 is an insulative layer that is responsible for separating the Heat Transfer Plate from the external environment in order to keep condensation from forming and maintain heat transfer to the heat exchanger. This operates on the principle of preventing heat transfer in the direction of the insulative face, and in doing so forces the heat to only move into the cold side heat exchanger and the fluid within. The insulative layer is made of an elastomer blend, and is selected based on operating temperature range the heat transfer plate will experience, properties that will prevent condensation at the lowest possible temperature the cooling system will produce and insulative ability. It is within reason to find other materials to be used as an insulative layer for the heat transfer plate, provided they match the requirements of the elastomer in use as the insulative material in this embodiment. In this embodiment the material is shaped to match the heat transfer plate by material removal, in other embodiments the manufacturing process may contain or solely consist of combining finite sized particles of either liquid or solid-state material, or in other embodiments the material may require no manufacturing process at all. This is material is shaped based on the dimensions and features of the heat transfer plate, the shape may differ in other embodiments, provided they are driven by the dimensional changes of the heat transfer plate. In this embodiment the heat transfer plate insulation is chemically bonded to the heat transfer plate, in other embodiments it is possible to use a semi-permanent connection via compression and or connect the insulation to the rearmost cold side insulation housing which is placed above the heat transfer plate and the threaded connector passes through. It is possible in alternate embodiments to use no insulation on the heat transfer plate, provided the cold side heat exchanger housing material provides the same insulative properties.

The Cold Side Insulation Housing 206 holds the Heat Transfer Plate Insulation and the Cold Side Heat Exchanger Insulation in a thermoplastic casing, which continues the separation of the cooling system's cold side and the external environment to prevent condensation and maximize the heat extracted from the heat source. This component as a member of the cooling system housing is used to hold in place the insulative material for the cold side heat exchanger and the heat transfer plate via compression and arrangement of the components; while providing a feature that allows the connections to and from both components. The cold side insulation housing is made of a thermoplastic with properties that meet or exceed the following qualifications: it must maintain a solid state form under the maximum range of possible operating temperatures the cooling system may experience, must have sufficient tensile and shear stress limits to withstand the mounting forces caused by fastening, and be capable of modification to include the necessary dimensions and features. In other embodiments, it is possible for a different material choice, that meets or exceeds the above design specifications, and may also include performing the role of an insulator based on the specified insulative properties of those components, in order to fulfil the goal of the containing and housing the insulative material for the cold side heat exchanger and the heat transfer plate. This also means that in other embodiments it is possible for the subtraction of this housing component, provided the insulative material contains material properties that allow it to be a substitute for a separate insulation component and housing to support said component. This component is initially manufactured via material removal, to achieve the desired shape and features to form the housing, and then has the insulative material for the cold side heat exchanger chemically bonded to the desired location. In alternate embodiments, the manufacturing process may contain or solely consist of combining finite sized particles of either liquid or solid-state material, for the initial housing shape, and may have both insulative components bonded to the housing, or neither if the insulative material is specified to be fixed to the housing in a non-permanent manner. Also, in other embodiments, the cold side insulation housing may differ in dimensional package, provided it is driven by the modification in the dimensions of the cooling system housing and/or components within the cooling system.

A top and side view 213 and 214, of the cooling system are provided to display the assembled view of the cooling system with all components fixed within, and the mounting bracket shown in its installed position on the exterior. This view indicated the complete system in a present embodiment of the invention.

FIG. 3 is a perspective view of the Heatsink Assembly, which is made up of three components: the heatsink heat transfer plate 304, the heatsink insulation 305, and the heatsink housing 303; all of which will be used in this invention to initialize the heat transfer process away from the heat source, and provides locations for the Modular Connector to connect and continue the heat transportation away from the heat source. As a member of the heat transportation components, this assembly has the advantage over typical solid-state heat transport and extraction devices, in the removal of stresses caused by mounting the heatsink to the heat source. In this embodiment, the heatsink assembly is shaped to match a commonly electronic device within modern computers, an Intel semiconductor, which is the heat source the heatsink is responsible for extracting heat from, thus beginning the heat transportation process, and is mounted to a semiconductor electrical control board with cooling system mounting requirements from the same manufacturer. One of those requirements is regarding the maximum weight of the cooling solution attached to the control board, and as a byproduct of this weight limit is a limit on the amount of material which can be used to form the cooling solution. The heat transportation components in general and the heatsink assembly specifically avoid this limit by only mounting one of heat transportation components to the control board. In doing so, utilizing the additional mounting point of the additional heat transportation components provides a greater amount of heat transportation material over traditional solid-state cooling solutions.

Optional components that may be found in other embodiments may include: thermal interface material to fill in surface imperfections to ensure connection between two differing surfaces which also aids heat transfer, or insulative caps on unused connector interface locations; utilized to satisfy the requirements of those additional embodiments. Within this embodiment those components are not shown or necessary to fulfil the requirements of this embodiment. In this embodiment, the Heatsink Assembly takes on a rectangular shape to match the dimensions of common electronic component housings, which are the heat source. In alternative embodiments, the shape may be of a different modified polygonal shape to match the dimensions of the heat source and/or the circuit board responsible for holding the electronic component which is the heat source.

The Heatsink Heat Transfer Plate 304 is a metal plate primarily responsible for transferring heat away from the connected component, and by the utilization of threaded holes, accept the connection of the Modular Connector which further facilitates the heat transfer to the Cold Side Heat Exchanger. The heatsink heat transfer plate is made of a metal with high heat capacity and heat transfer properties, and is then shaped to match what is defined as the heat source. In this embodiment, the heat source is a mass-produced semiconductor but may be extended to contact multiple other components in other embodiments as the heat source may not be in one singular package or location. The metal plate is then machined to include holes and threads to fit a desired number of connectors to the face not in contact with the heat source. In this embodiment there exist four locations for connectors to make contact with the heatsink heat transfer plate, in other embodiments it is possible to fit any positive integer value of locations to accept connections, with or without additional components to facilitate these connections to the heatsink heat transfer plate. In this embodiment the manufacturing process to acquire the desired shape and features is via material removal, in other embodiments, the manufacturing process may contain or solely consist of combining finite sized particles of either liquid or solid-state material.

The Heatsink Insulation 305 is the insulative layer that covers the portions of the Heatsink Heat Transfer plate not in contact with the electronic component heat source or the modular connector. Its role is to prevent heat from escaping to the environment, which also prevents condensation from forming on the surfaces in contact with the insulative material and also maximizes the heat transfer to the Modular Connector. The insulative layer is made of an elastomer blend, and is selected based on operating temperature, properties that will prevent condensation at the lowest possible temperature the cooling system will produce and insulative ability. In this embodiment the material is shaped to match the connector housing by material removal, in other embodiments the manufacturing process may contain or solely consist of combining finite sized particles of either liquid or solid-state material, or in other embodiments the material may require no manufacturing process at all.

The Heatsink Housing 303 is a thermoplastic housing which holds the Heatsink and the Heatsink Insulation and has locations to facilitate the fastening of the complete assembly to the specified location. The heatsink housing is made of a thermoplastic with properties that meet or exceed the following qualifications: it must maintain a solid state form under the maximum range of possible operating temperatures the system may experience, must have sufficient tensile and shear stress limits to withstand the mounting forces caused by fastening, and be capable of further shape modification. The mounting location and overall shape of the heatsink housing in this embodiment is driven by the shape of currently existing electronic component control board cooling solution mounting location; it is possible within other embodiments for this housing to take a different shape due to the location(s) of the heat source and the shape of either currently existing cooling solution mounting location(s) or the requirement of creating new mounting locations(s). In this embodiment the material is shaped to create space for the bonding of the insulative layer and placement of the metal plate. In this embodiment to vertically separate the halves of the housing, and in other embodiments the housing may be provided as a single solid piece or broken down into a variety of pieces, separated into multiple pieces for assembly.

A top view 301 and bottom view 302, of the Heatsink Assembly fully assembled in the form to support a commercially available Intel semiconductor and the manufacturer specified semiconductor cooling solution mounting locations.

FIG. 4 contains a side view of the multiple connector types within the present embodiment of the invention, that make up the modular connector assembly, which is the primary method of transporting heat away from the heat source, and bridging the gap between the Heatsink and fluid within the Cold Side Heat Exchanger of the cooling system. In this embodiment, the provided connectors are: the threaded connector, the straight connector, the 90-degree connector, and the swivel connector. In this embodiment the individual connectors are made with a shared material and sub-component arrangement. The sub-component(s) responsible for heat transfer and transport are made of a material with high heat capacity and heat transfer properties; the sub-component(s) responsible for insulation consists of a material that is selected based on: operating temperature range, properties that will prevent condensation at the lowest possible temperature the cooling system and insulative ability; the housing material, responsible for encasing the sub-components consists of properties that meet or exceed the following qualifications: it must maintain a solid state form under the maximum range of possible operating temperatures the system may experience, must have sufficient tensile and shear stress limits to withstand the mounting forces caused by fastening, and be capable of further shape modification; the connection method of combining individual sub-components, to form an individual sub-connector consists of utilizing features on the metal body to accept the fastening the of components in their desired arrangement, and the connection of each sub connector to form the totality of the modular connector consists of, utilizing features within the metal body to facilitate the acceptance of fastening to another individual connector housing, to create contact between two separate metal bodies. Each connector has variations in geometric shape and number of components, to accomplish the goal of making the modular connector capable of, maintaining a continuous metal-to-metal path for heat transfer between two points in space, in various configurations of individual geometric shaped connectors. It is optional in another embodiment to include additional geometric shaped connectors of the same and/or different: material; insulative methods or materials; fastening method to combine sub-components to create an individual connector, or to connect individual connectors together to form the totality of the modular connector; housing shape, style or material; lack of using a separate housing component; usage of insulative material; placement of the insulative material relative to the housing; usage of additional components to maximize heat transfer between connectors and the overall geometric shape of the individual connector or sub-components that make up an individual connector.

The Threaded Connector 402 is responsible for connecting to the threaded hole features within the Heat Transfer Plate and Heatsink, and in doing so, are the beginning and end of the Modular Connector assembly. This connection is made possible by using a threaded shaft on the male end of the connector to be placed into the threaded holes. The female side of the connector which allows connection to any male ended individual connector, is made possible by use of dimensional restrictions on the connector housing and fastening locations placed parallel to the face of the connector. In this embodiment, the connector is used as the beginning and the end connection points within the modular connector loop; it is optional in other embodiments to use a differing mounting mechanism to secure the ends of the threaded connector to bodies responsible for heat transfer and/or storage.

The Straight Connector 401 is a straight connector which can be used to bridge a horizontal or vertical gap between individual connectors. As a linear connector containing a male end to connect to the female end of a connector and a male end to connect with a female connector end, the connector increases the reach of the preceding connector and maintains a female end to allow connection to the following male connector. In this embodiment the connector is used to extend the female ended reach of the threaded connectors, prior to the addition of following connectors to create a modular connector loop. In other embodiments, the straight connector can be modified to contain a different gendered end or be of a differing size provided it maintains the desired goal of acting as an extension from the previous connector to the following connector.

The 90-Degree Connector 403 and 404, is a connector that is used for directional changes in a 90-degree fashion and can be rotated at the ends to provide the user with additional configuration flexibility. In this embodiment, the 90-degree connector is used to create 90-degree bends in the connector patch, which modifies the height the next connector will be required to overcome by using perpendicular orientation. Which when used to build a complete modular connector loop, the 90-degree connector can be utilized to modulate the vertical height required to reach the following threaded connection. This connector comes in two configurations: 90-Degree-Male 403 and 90-Degree-Female 404. They are defined by a minor difference within the dimensions of the connector housing, as the housing for the male 90-degree connector is intended to connect to only female ends of a connector and the female 90-degree connector is intended to connect only to male ends of a connector. It is optional in other embodiments: to use only one variant of the 90-degree connector, as in male only or female only to aid in completion of a complete modular connector loop; or to no use either 90-degree connector to form a modular connector loop.

The Swivel Connector 405 is a connector made up of 3 sub-connector bodies each serving a specific purpose to facilitate angle and height adjustment, to make formation of the complete Swivel Connector. The name of the sub connector bodies and their primary and secondary functions as connectors are: the slotted connector, containing a male end to connect to female ended connectors and a slotted end for connection to the pivot, whose function within the swivel connector assembly is to provide the slotted feature which allows length and angle changes for the additional members of the swivel connector; the pivot, which provides connection to both the slotted connector and the height adjustable connector, is used as a pivoting arm by utilizing the connection to the slotted feature, and provides the threaded hole feature for the height adjustable connector; the height adjustable connector, which connects to the threaded hole feature of the pivot, utilizes that feature to adjust height via a threaded rod feature on the male end of the sub-component, which aids the female end in adjusting height to facilitate connection the following connector which continues the modular connector loop. In this embodiment three heat transport bodies are used to form the swivel connector sub-connector, it is possible in other embodiments to utilize the use of any number of individual heat transport bodies to form the swivel connector sub-connector, provided they maintain the functionality of angle and height adjustment. Additionally, in other embodiments the method for mounting the height adjustable connector can utilize a non-threaded body and additional features to maintain the height adjustment functionality. In addition, it is possible in other embodiments for the pivot direction to not be limited to one degree of freedom or have a completely different degree of freedom than what is depicted in this embodiment. Also, in other embodiments, it is possible to not use the swivel connector as a sub-connector within the modular connector loop.

FIG. 5 is an exploded view of the sub-components that make up the sub-connectors within the Modular Connector assembly. Each of the sub-connectors has a primary function as a heat transporting body within the modular connector loop, facilitated by communicable connection amongst the sub-connector assembly and the components that make up a sub connector. The Threaded Connector is broken down into three sub-components: the housing 504, the metal body 506, and the insulative layer 505. The Straight Connector is broken down into three sub-components: the housing 501, the metal body 503, and the insulative layer 502. The 90-Degree-Male Connector is broken down into three sub-components: the housing 507, the metal body 509, and the insulative layer 508. The 90-Degree-Female Connector is broken down into three sub-components: the housing 512, the metal body 510, and the insulative layer 511. The Swivel Connector consists of sub-components: the swivel body 518, the pivot 517, the height-adjustable body 516, the height adjustable insulative layer 515, the upper housing shell 514, the lower housing shell 519, the height adjustable connector shell 515, and the insulative layer placed on the upper and lower housing shell.

FIG. 6 provides multiple views of a modular connector loop, comprised of multiple individual sub-connectors shown in the above FIGS. 4 and 5.

In this FIG. 7, are the drawings of the two sub-systems of the present invention, in assembled and installed form that make up the totality of the patented system, which is defined as a remote mounted active phase change cooling system with a modular connector that transports heat to the cooling system. The first sub-system the cooling system 702, displays the cooling system components packaged for remote mounting. In this embodiment, the cooling system is defined as a remotely located, active phase change cooling system, it is possible in other embodiments to modify the individual components within to better facilitate phase change of the various possible fluids used within the cooling system. The second sub-system, the modular connector 703, contains the necessary sub-connectors to bridge a gap from the Heatsink Assembly 704 to the cooling system assembly 702. In this embodiment, the modular connector loop is made up of this assortment of connectors: threaded, straight, 90-Degree male and female, and swivel. This embodiment is an example to show the potential usage of each of the individual connectors to form a total modular connector assembly. In other embodiments, it is possible to use any number of connectors or combination of connectors of any shape, provided they are used to facilitate heat transportation from the heat source to the cooling system. The heat transfer plate within the cooling system is also a component within this loop, as is the heatsink assembly; per their primary role in heat transportation from the heat source which is an electronic component, to the cold side heat exchanger which is the primary cooling device. No fluid responsible for cooling is moved through the components for heat transport, as the heat transportation device is solid-state and its primary function is the role of transporting heat to the cooling system and is not responsible for cooling.

This system which forms the present invention provides increased cooling potential, higher thermal capacity without exceeding weight limitations, safety from cooling fluid exposure to critical components, and the ability to cool components in remote locations. The system may be integrated into a multitude of commercially available electronic enclosures, or mounted in custom locations driven by the choice of the end user.

The present invention may provide all or some of the stated benefits within this document, depending on the specifications as enacted. Not all benefits will be required for all applications, and the failure to provide a desired benefit in any particular application or combination of applications should not be interpreted to limit the scope of the claims made. Although the present invention has been described in considerable detail with reference to certain preferred variations thereof, it is understood that other alternatives and equivalents of each of the above embodiments at within the scope of the invention. Therefore, in the spirit and scope of the appended claims should not be limited to the description of the preferred versions contained therein. Accordingly, all such modifications are intended to be included within the scope of the invention as defined in the following claims. In the claims, means-plus-function clauses are intended to cover the structures described herein as performing the recited function and not only structural equivalents, but also equivalent structures.

It will be apparent to one with skill in the art that the cooling system and modular connection system of the invention may be provided using some or all of the mentioned features and components without departing from the spirit and scope of the present invention. It will also be apparent to the skilled artisan that the embodiments described above are specific examples of a single broader invention which may have greater scope than any singular descriptions taught. There may be many alterations made in the descriptions without departing from the spirit and scope of the present invention.

The invention claimed is:

1. A system for active phase change cooling system with connections to accept a remote modular heat transportation system comprising:
    a plurality of heat exchangers comprised of a material shaped to meet the requirements of: ability to maintain solid state at the maximum and minimum temperature produced by the fluid, material strength to maintain shape while experiencing pressure from the fluid and weight from supporting the complete system during mounting, heat capacity and heat transfer ability, and ability to resist corrosion from exposure to the fluid at various phase states; with features: shaped tubing to transport fluid through the exchanger, shaped members named as fins to provide greater material surface area, and surface-to-surface connection between the fins and the tubes; utilized to transfer heat between the material of the exchanger and the fluid within the exchanger, aided by external devices that transport heat to and from the exchanger(s);
    a compressor to modify fluid pressure and flow, comprised of a material selected, shaped and formed to meet the requirements of: ability to maintain solid state at the maximum and minimum temperature produced by the fluid, material strength to maintain shape while experiencing pressure from the fluid while acted upon within the compressor, and ability to resist corrosion from exposure to the fluid at various phase states; with features: sealed compressor internal environment, dimension specific compressor wheel for fluid manipulation, oil-less operation to maintain purity of fluid within the compressor, compressor shaft connection to the motor and compressor wheel via geometry meshing; and utilized for: driving the phase change operation of the cooling system, mobilizing the fluid to move between heat exchangers, and control the amount of cooling potential within the total cooling system;
    a plurality of fluid transportation piping comprised of a material selected, shaped and formed to meet the requirements of: wall thickness to withstand applied fluid pressure, ability to maintain solid state at the maximum and minimum temperature produced by the fluid, and ability to resist corrosion from exposure to the fluid at various phase states; with features: phase change process driven dimensions, pressure and flow modification driven by the internal dimensions of the piping; and utilized for pressure and flow modification and transportation of the fluid within the walls of the piping;
    a control unit with an electrical power input and output connections, the control unit connected to the drive motor on the output connection, and the control unit connected to the external power unit on the input connection;
    a drive motor connected to the compressor to drive fluid state modification within a cycle of the phase change process and mobilize fluid for movement through additional components of the cooling system, controlled via power delivered from the control device;
    an insulative material comprised of a material selected, shaped and formed with the requirements of: ability to maintain solid state at the maximum and minimum temperature the insulated components will experience, insulative properties that meet or exceed the system driven requirements, ability to be shaped for surface-to-surface contact with required components; with features: connection to the component, shape and size driven by the surface(s) dimensions the material will envelop; utilized to contain the temperature of the connected surface from escaping to the external environment adjacent to the surface; applied to these components: cold side heat exchanger, heat transfer plate, fluid transport piping, compressor assembly, and primary and secondary housing;
    a heat transfer plate comprised of a material selected, shaped and formed with the requirements of: ability to maintain solid state at the maximum and minimum temperature the heat transfer plate will experience, material strength to maintain shape while experiencing pressure from the weight of supporting the modular connector, heat capacity and heat transfer ability; with features: to accept connection from the modular connector, to accept attachment of insulating elastomers, and to accept thermal interface material(s) to improve surface-to-surface communication of heat; used to accept connection from the modular heat transportation system and transfer heat to the contacting heat exchanger;
    a set of housings made of a material selected, shaped and formed to meet the requirements of: ability to maintain solid state at the maximum and minimum temperature the contained components will produce, material strength to maintain shape while experiencing pressure from supporting components within the housing and weight from supporting the complete system during mounting, ability to contain components within the housing, and ability to create locations to hold each component in a fixed semi-permanent manner; with features of: a primary and secondary housing where the primary housing contains these components: hot side heat exchanger, exhaust fan, cold side heat exchanger, fluid transfer pipes, heat transfer plate, insulation, cold side heat exchanger insulation housing; and a secondary housing contains these components: fluid transfer pipes, compressor assembly, insulation drive motor, motor controller, and electrical connectors for motor controller; utilized for enclosure of all components used in the cooling system, providing access and insulation for the modular connector which is attached to the cooling system, and providing support and connection locations for the mounting bracket to be secured;

a mounting mechanism comprised of a material selected, shaped and formed with the requirements of: ability to maintain solid state at the maximum and minimum temperature the mounting bracket will experience, and material strength to maintain shape while experiencing pressure from the weight of supporting the cooling system during mounting; with features: locations for the mounting bracket attachment to the housing, locations to connect the mounting bracket to the installation location via securing features placed on the mounting bracket, and ability to interface with the securing features to secure the mounting bracket to the installation location; utilized for containment of the cooling system housing and allow to the user to mount the cooling system either within an electronic component enclosure or upon any device that accepts the securing features contained within the bracket.

2. A system for modular solid-state heat transportation from heat source to cooling source via formed linking connectors comprising:

a connector body which forms the primary component of the modular solid-state heat transportation connector, comprised of a material shaped, selected and formed based on the requirements of: ability to maintain solid state while exposed to temperature range caused by transporting heat from the heat source(s), heat transfer ability, heat capacity, ability to be modified for the addition of features, strength to withstand stresses caused by: joining of additional connectors, joining of components placed external to the metallic body, supporting adjacent connector(s) within the connector loop and the functional operation of features contained within an individual connector; comprised of features: dimensional packaging and features to fulfil individual connector role, locations to connect additional sub-components of an individual connector, locations to connect individual connectors together to form connector loop; utilized for: individual connector modularity to provide constant and stable connection within the connector loop given unique environments, transfer heat without exposing heat source to a potentially damaging non-solid state heat transportation device, provide connection location for linking to additional connectors;

an insulative component comprised of a material(s) shaped, selected and formed based on the requirements of: ability to maintain solid state at the maximum and minimum temperature the insulated components will experience, insulative properties that meet or exceed the system driven requirements, ability to be shaped for surface-to-surface contact with required components; with features: connection to component, shape and size driven by the surface(s) dimensions the material will envelop; utilized to contain the temperature of the connected surface from escaping to the external environment adjacent to the surface; placed on the metallic body(bodies) of an individual connector;

an individual connector housing comprised of a material shaped, selected and formed based on the requirements of: ability to maintain solid state at the maximum and minimum temperature the enclosed components will produce, material strength to maintain shape while experiencing pressure from: supporting components within the connector housing and supporting adjacent connected connectors in a complete loop of connected connectors, ability to contain components within the housing, and ability to create locations to: hold each connector in a fixed semi-permanent manner and to hold sub-components of a connector in a fixed semi-permanent manner; with features: dimensional package to provide gendered connection to additional connectors, locations for joining connectors together, and locations for mounting the housing to the connector body(bodies) with additional sub-components in-between both; utilized for: defining the connector gender which determines which additional connectors can be attached, providing a fixed semi-permanent location to ensure securing of insulative material to the connector metal body, and locations to provide fixed semi-permanent connection of connectors to each other;

a plurality of connector features which drive the connector body dimensional package and utility as both an individual modular connector and as a complete connector modular loop composed of individual connectors, is comprised of: packaging to fulfill the dimensional requirements, angle, height and rotational modification of the path the connector loop creates, and connector-to-connector interconnection; utilized to form a complete connector loop comprised of individual modular sub-connectors, which provides heat transportation in a plurality of environments where the connector may be applied;

a plurality of thermal interface material(s) used to aid connector-to-connector heat transportation selected and shaped based on the requirements of: ability to maintain solid state during exposure to the temperature range the connector(s) will experience, heat capacity, thermal conductivity and ability to be modified to match the dimensional package of surface where connectors meet; comprised of features: hardness to prevent displacement away from the surfaces while in contact, and ability to be fixed to the surface of a connector; utilized for: increasing the thermal conductivity of connectors in contact and aid heat transportation through the connector loop;

a heatsink component to be secured to the heat source for the purpose of and is comprised of a material selected, shaped and formed with the requirements of: ability to maintain sold state while exposed to the maximum and minimum temperature the heat source creates, material strength to maintain shape while experiencing pressure from the weight of supporting the modular connector and connection to heat source mounting location, heat capacity and heat transfer specifications, ability to be modified to accept insulative material, ability to be modified for the addition of connective features to aid connection to the modular connector, ability to be modified to create connections for the housing sub-component to be attached to the heatsink component; comprised of features: to accept connection from the modular connector, to accept attachment of insulating material(s), and to accept attachment of thermal interface material(s) to improve surface-to-surface communication of heat; utilized for: connecting the heat source to the modular connector loop, transporting heat to the cooling system, connection to previously existing cooling system locations located on the heat source mounting board which fix the heat sink to the heat source, and acceptance of heatsink housing and insulative material for prevention of heat escaping to external environment.

* * * * *